United States Patent
Choi

(10) Patent No.: US 9,453,283 B2
(45) Date of Patent: Sep. 27, 2016

(54) METHOD FOR MANUFACTURING NANOWIRES

(71) Applicant: SAMSUNG DISPLAY CO., LTD., Yongin-si, Gyeonggi-do (KR)

(72) Inventor: Kyung Min Choi, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/624,318

(22) Filed: Feb. 17, 2015

(65) Prior Publication Data

US 2016/0047048 A1 Feb. 18, 2016

(30) Foreign Application Priority Data

Aug. 14, 2014 (KR) .................. 10-2014-0105634

(51) Int. Cl.
| | |
|---|---|
| *C23C 16/56* | (2006.01) |
| *C23C 14/16* | (2006.01) |
| *C23C 16/40* | (2006.01) |
| *C23C 14/00* | (2006.01) |
| *C25D 7/06* | (2006.01) |

(52) U.S. Cl.
CPC ........... *C23C 16/56* (2013.01); *C23C 14/0021* (2013.01); *C23C 14/165* (2013.01); *C23C 16/402* (2013.01); *C25D 7/0607* (2013.01)

(58) Field of Classification Search
CPC .. C23C 16/56; C23C 14/0021; C23C 14/165
See application file for complete search history.

(56) References Cited

U.S. PATENT DOCUMENTS

| | | | |
|---|---|---|---|
| 2006/0212975 A1 | 9/2006 | Choi et al. | |
| 2010/0266478 A1 | 10/2010 | Kim et al. | |
| 2011/0262772 A1* | 10/2011 | Hauge | B29C 43/22 428/688 |
| 2013/0128362 A1 | 5/2013 | Song et al. | |
| 2014/0227454 A1* | 8/2014 | Matsumoto | B01J 37/08 427/535 |

FOREIGN PATENT DOCUMENTS

| | | | | |
|---|---|---|---|---|
| JP | 2007-055840 A | | 3/2007 | |
| JP | 2013-27843 | * | 7/2013 | ............ B01J 37/34 |
| JP | 2013-219203 A | | 10/2013 | |
| KR | 10-2006-0098959 A | | 9/2006 | |
| KR | 10-2010-0067048 A | | 6/2010 | |
| KR | 10-2013-0016179 A | | 2/2013 | |
| KR | 10-2013-0060662 A | | 6/2013 | |

(Continued)

OTHER PUBLICATIONS

Albao et al., Atomistic modeling of morphological evolution during simultaneous etching and oxidation of Si(100), Surface Science 555 (2004) 51-67, 17 pages, published on Feb. 9, 2004.

(Continued)

*Primary Examiner* — Duy Deo
*Assistant Examiner* — Mahmoud Dahimene
(74) *Attorney, Agent, or Firm* — Innovation Counsel LLP

(57) ABSTRACT

A method of manufacturing a nanowire includes: forming a silicon oxide layer by performing deposition of a silicon oxide on a substrate; forming a metal layer by performing deposition of a metal on the silicon oxide layer; forming a metal agglomerate by performing heat treatment on the substrate where the metal layer is formed; and growing a nanowire in an area where the metal agglomerate is formed by performing plasma treatment on the substrate where the metal agglomerate is formed.

10 Claims, 7 Drawing Sheets

(56) References Cited

FOREIGN PATENT DOCUMENTS

| KR | 10-2013-0099988 A | 9/2013 |
| --- | --- | --- |
| KR | 10-1341548 B1 | 12/2013 |

OTHER PUBLICATIONS

Danilkin et al., Effect of quartz window temperature on plasma composition during STI etch, Micro- and Nanoelectronics 2007, Proc. of SPIE vol. 7025, 70250E, 10 pages, (2008).

Daineka et al., Enhanced etching of Si(100) by neutral oxygen cluster beam, Surface Science 519 (2002) 64-72, 9 pages, published on Aug. 6, 2002.

Park et al., Low temperature silicon dioxide film deposition by remote plasma enhanced chemical vapor deposition: growth mechanism., Surface and Coatings Technology 179 (2004) 229-236, 8 pages, Jun. 23, 2003.

Tinck et al., Modeling Cl2-O2-Ar inductively coupled plasmas used for silicon etching: effects of SiO2 chamber wall coating, Plasma Sources Sci. Technol. 20 (2011) 045012, 19 pages, published on Jun. 13, 2011.

Starodub et al., Silicon oxide decomposition and desorption during the thermal oxidation of silicon, Surface Review and Letters, vol. 6, No. 1 (1999) 45-52, Jul. 1, 1998.

\* cited by examiner

METHOD FOR MANUFACTURING NANOWIRES

CROSS-REFERENCE TO RELATED APPLICATION

This application claims priority to and the benefit of Korean Patent Application No. 10-2014-0105634, filed on Aug. 14, 2014, with the Korean Intellectual Property Office, the disclosure of which is incorporated herein in its entirety by reference.

BACKGROUND

1. Field

Aspects of embodiments of the present disclosure relate to a system and method of manufacturing a nanowire that enables adjusting the position and length thereof.

2. Description of the Related Art

Nanotechnology generally refers to fabrication of matter, elements, or systems having new or improved physical, chemical, and biological properties by manipulating, analyzing and controlling substances on the nanometer scale. The development of nanotechnology has introduced many different nanostructures, including nanowires and nanotubes, for example. Nanowires have many applications, such as in optical elements (e.g., lasers), transistors, capacitors, display substrates and memory devices.

SUMMARY

The present disclosure includes a method of manufacturing a nanowire that enables adjusting the position and length thereof.

According to an embodiment of the present system and method, a method of manufacturing a nanowire includes: forming a silicon oxide layer by performing deposition of a silicon oxide on a substrate; forming a metal layer by performing deposition of a metal on the silicon oxide layer; forming a metal agglomerate by performing heat treatment on the substrate where the metal layer is formed; and growing a nanowire in an area where the metal agglomerate is formed by performing plasma treatment on the substrate where the metal agglomerate is formed.

Forming the silicon oxide layer may include performing one of chemical vapor deposition (CVD) and plasma enhanced chemical vapor deposition (PECVD).

The silicon oxide layer may have a thickness of 80 nm to 120 nm.

The metal may be one of silver (Ag), copper (Cu), gold (Au), aluminum (Al), magnesium (Mg), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), niobium (Nb) and metal alloys thereof.

The metal may be silver (Ag) or a silver alloy.

Forming the metal layer may include performing one of a sputtering method, a vacuum deposition method, and an electroplating method.

The metal layer may have a thickness of 5 nm to 20 nm.

The heat treatment may be performed at a temperature of 50° C. to 600° C.

The plasma treatment may use gas comprising at least one of chlorine (Cl2) gas, nitrogen ($N_2$) gas, argon (Ar) gas and hydrogen ($H_2$) gas.

The method of manufacturing a nanowire may further include removing the residual metal agglomerate from a surface of the nanowire by performing wet etching on the substrate where the nanowire grows.

According to embodiments of the present system and method, the position and length of a nanowire can be selectively adjusted.

The foregoing is illustrative only and is not in any way limiting. The above-described aspects, embodiments, and features are further described below with reference to the drawings.

BRIEF DESCRIPTION OF THE DRAWINGS

The above and other features and aspects of the present system and method are described with reference to the accompanying drawings, in which.

DETAILED DESCRIPTION

Figure 1:
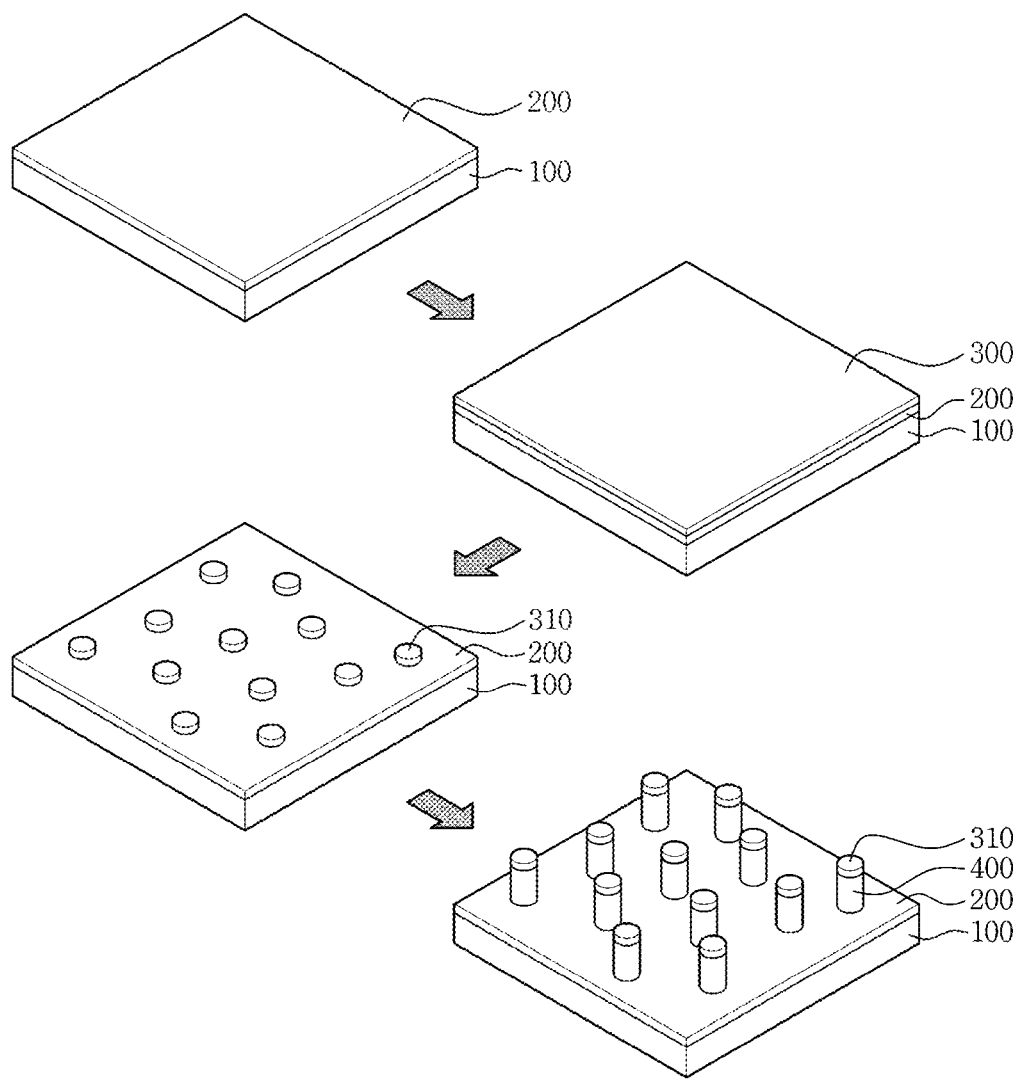
FIG. 1 provides schematic perspective views sequentially illustrating a method of manufacturing a nanowire according to an embodiment of the present system and method.

Advantages and features of the present system and method are described with respect to specific embodiments and the accompanying drawings. The present system and method may, however, be embodied in many different forms and are not limited to the embodiments set forth herein. Rather, these embodiments are provided as examples to help those of ordinary skill in the art to more conveniently understand the teachings of the present system and method. Like reference numerals refer to like elements throughout the specification.

The spatially relative terms "below", "beneath", "lower", "above", "upper", and the like, may be used herein to describe the relative positions of the elements or components as illustrated in the drawings. The spatially relative terms are intended to encompass different orientations of the device when in use or operation, in addition to the orientation depicted in the drawings. For example, if the device shown in the drawing is turned over, the device described as "below" or "beneath" another device in the drawing would then be oriented "above" the another device. Accordingly, the illustrative term "below" includes both the lower and upper positions, depending on the orientation of the device relative to that shown in the drawings. The device may also be oriented in other directions, in which case the spatially relative terms are to be interpreted accordingly depending on the orientation of the device relative to the orientation depicted in the drawings.

Throughout the specification, when an element is referred to as being "connected" to another element, the element may be "directly connected" to the other element, or "electrically connected" to the other element with one or more intervening elements interposed in between. The terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the meaning commonly understood by those of ordinary skill in the art to which the present system and method pertain. That is, terms, including those defined in commonly used dictionaries, have a meaning that is consistent with the context of the relevant art unless clearly defined in the present specification.

Referring to FIG. 1, a method of manufacturing a nanowire according to an embodiment of the present system and method may include: forming a silicon oxide layer 200, forming a metal layer 300, forming a metal agglomerate 310, and growing a nanowire 400.

The silicon oxide layer 200 may be formed of silicon oxide ($SiO_2$) by performing chemical vapor deposition (CVD) or plasma enhanced chemical vapor deposition (PECVD) on a substrate 100. However, the present system and method are not limited thereto. Thus, other known deposition methods may be employed, such as thermal chemical vapor deposition (T-CVD) or inductively coupled enhanced chemical vapor deposition (ICPECVD).

The substrate 100 may include one or more of a glass substrate, a silicon substrate, a ceramic substrate, and a polymeric substrate.

The silicon oxide layer 200 may have a thickness of 80 nm to 120 nm. For example, the silicon oxide layer 200 may have a thickness of 100 nm.

The metal layer 300 may be formed by a sputtering method, a vacuum deposition method, or an electroplating method. However, the present system and method are not limited thereto, and thus other known deposition methods may be employed.

The metal layer 300 may be one of silver (Ag), copper (Cu), gold (Au), aluminum (Al), magnesium (Mg), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), niobium (Nb) and metal alloys (e.g., silver alloy) thereof.

The metal layer 300 may have a thickness of 5 nm to 20 nm. For example, the metal layer 300 may have a thickness of 10 nm.

The metal agglomerate 310 may be formed by performing heat treatment on the substrate 100 on which the metal layer 300 is formed. That is, the metal of the metal layer 300 may undergo agglomeration by the heat treatment to form the metal agglomerate 310. The area and position of the metal agglomerate 310 may be defined by adjusting the temperature and duration of the heat treatment. The heat treatment may be performed at a temperature of 50° C. to 600° C., and more particularly, 280° C. to 320° C.

The nanowire 400 may be grown by performing plasma treatment on the substrate 100 where the metal agglomerate 310 is formed. The plasma treatment may include using one or more of a chlorine (Cl2) gas, nitrogen ($N_2$) gas, argon (Ar) gas and hydrogen ($H_2$) gas.

Silicon oxide ($SiO_2$) of the silicon oxide layer 200 may be dissociated and then dissolved and diffused in the metal agglomerate 310 by the plasma treatment to grow the nanowire 400. The nanowire 400 may grow in a vertical direction in an area where the metal agglomerate 310 is formed. The length of the nanowire 400 being grown may be controlled by adjusting the duration of the plasma treatment.

Figure 2:
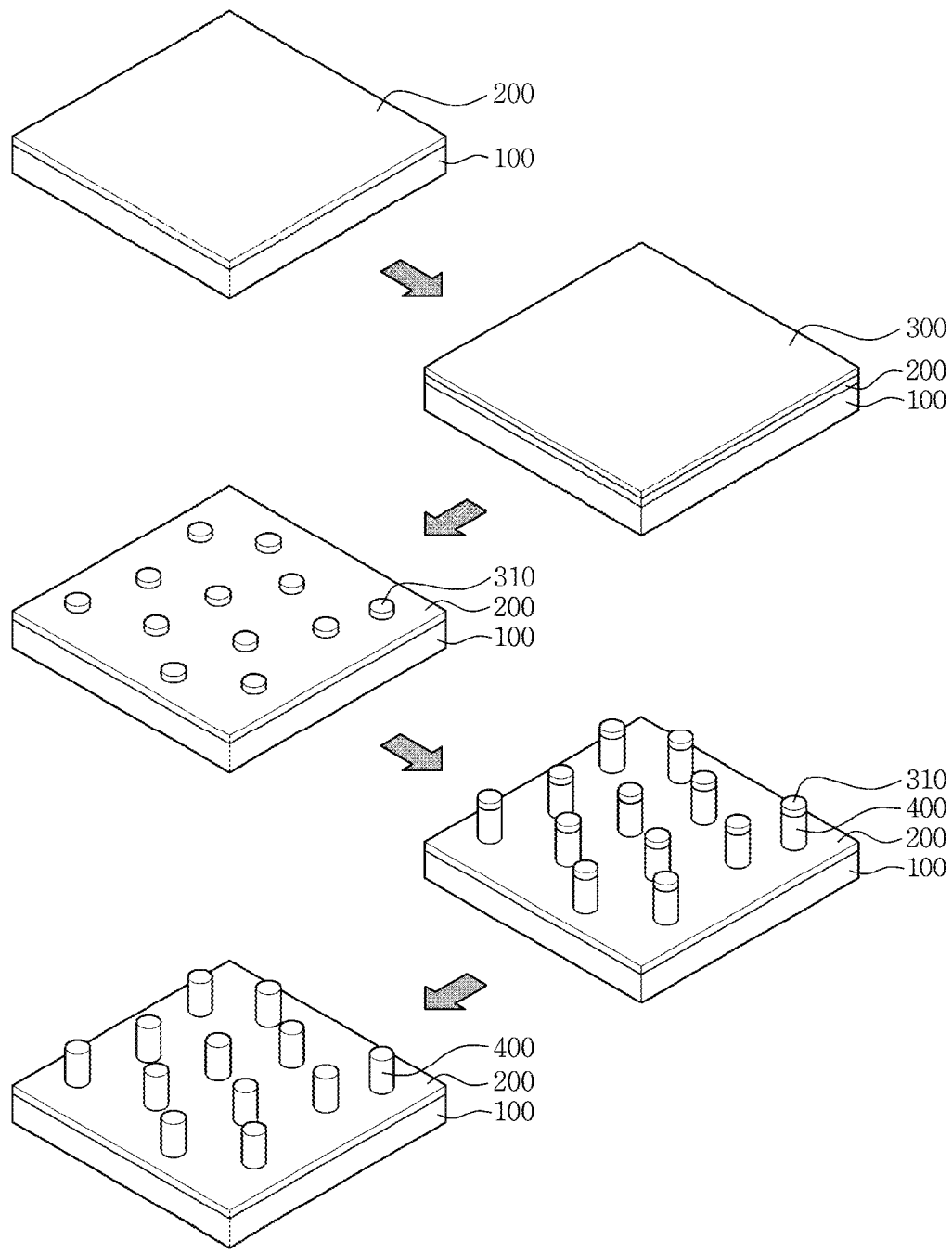
FIG. 2 provides schematic perspective views sequentially illustrating a method of manufacturing a nanowire according to another embodiment of the present system and method.

Referring to FIG. 2, a method of manufacturing a nanowire according to another embodiment of the present system and method may further include removing the metal agglomerate 310 after the growing of the nanowire 400, compared to the method of manufacturing the nanowire of FIG. 1. To remove the residual metal agglomerate 310 from a surface of the nanowire 400, wet etching may be performed on the substrate where the nanowire 400 is grown. However, the present system and method are not limited thereto, and thus, other known etching methods may be employed.

The present system and method are described further below with reference to Exemplary embodiments 1 through 4. Exemplary embodiments 1 through 4 described below are illustrative only and are not limiting.

Exemplary Embodiment 1

Manufacturing of a Nanowire by Performing Heat Treatment and 40 Seconds of Plasma Treatment In this embodiment, silicon oxide ($SiO_2$) is deposited on a glass substrate by performing the plasma enhanced chemical vapor deposition (PECVD), thereby forming a silicon oxide layer of about 100 nm in thickness. Next, silver (Ag) is deposited on the silicon oxide layer by sputtering, thereby forming a silver (Ag) layer of 10 nm in thickness. Subsequently, the glass substrate on which the silver (Ag) layer is formed is subject to heat treatment at 370° C., thereby forming a silver (Ag) agglomerate. Lastly, the substrate on which the silver (Ag) agglomerate is formed is subject to the plasma treatment, thereby manufacturing a nanowire. The plasma treatment is performed by injecting a gas mixture of $Cl_2$ (270 sccm) and $N_2$ (30 sccm) into a chamber and applying a power of 3KW and a process pressure of 20 mtorr to the chamber.

Figure 3:
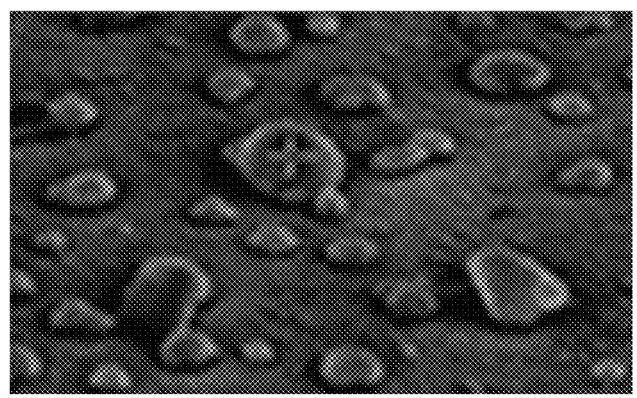
FIG. 3 is a focused ion beam (FIB) picture of a substrate having silver (Ag) agglomerates formed thereon in the manufacturing of a nanowire according to Exemplary embodiment 1.
Figure 4:
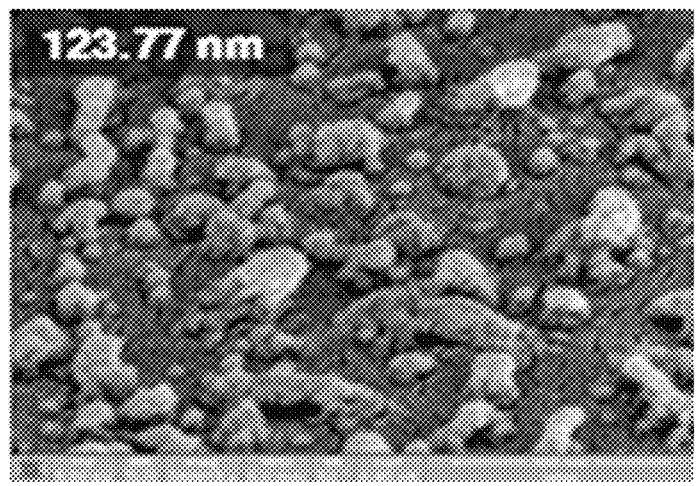
FIG. 4 is a FIB picture illustrating a nanowire according to Exemplary embodiment 1.

The FIB picture of FIG. 3 shows that a plurality of silver (Ag) agglomerates is formed on the silicon oxide layer by the heat treatment. The FIB picture of FIG. 4 shows that the silicon oxide ($SiO_2$) nanowire grows to 123.77 nm in length with 40 seconds of the plasma treatment.

Exemplary Embodiment 2

Figure 5:
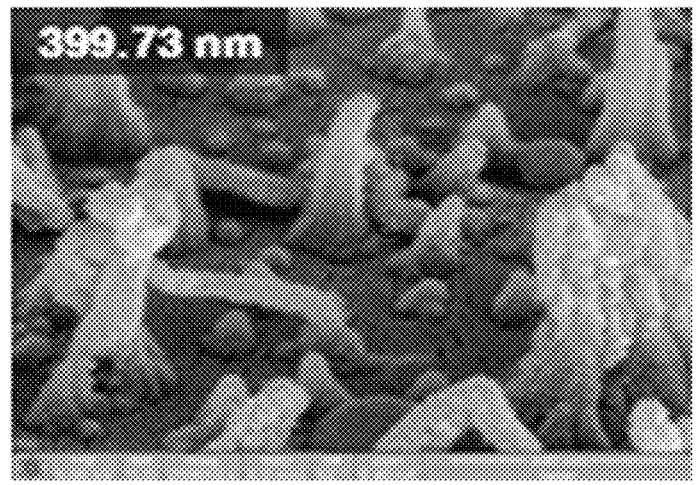
FIG. 5 is a FIB picture illustrating a nanowire according to Exemplary embodiment 2.

Manufacturing of a Nanowire by Performing Heat Treatment and 80 Seconds of Plasma Treatment Exemplary embodiment 2 employs the same condition and method of Exemplary embodiment 1, except the plasma treatment is performed for 80 seconds. The FIB picture of FIG. 5 shows that the silicon oxide ($SiO_2$) nanowire grows to 399.73 nm in length with 80 seconds of the plasma treatment.

Exemplary Embodiment 3

Figure 6:
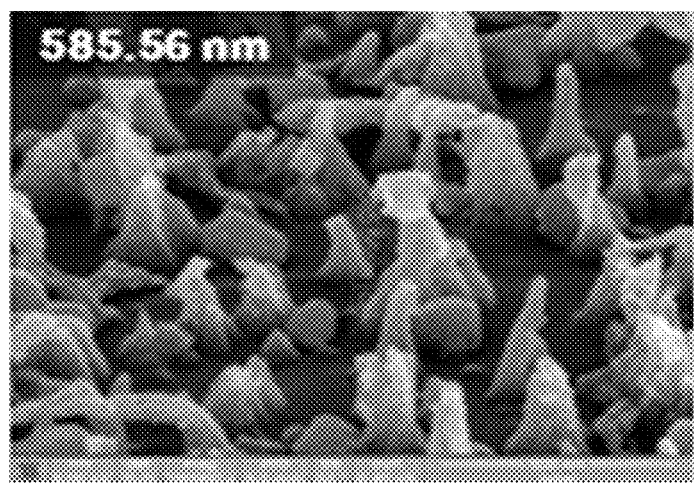
FIG. 6 is a FIB picture illustrating a nanowire according to Exemplary embodiment 3.

Manufacturing of a Nanowire by Performing Heat Treatment and 120 Seconds of Plasma Treatment Exemplary embodiment 3 employs the same condition and method of Exemplary embodiment 1, except the plasma treatment is performed for 120 seconds. The FIB picture of FIG. 6 shows that the silicon oxide (SiO$_2$) nanowire grows to 585.56 nm in length with 120 seconds of the plasma treatment.

Exemplary Embodiment 4

Figure 7:
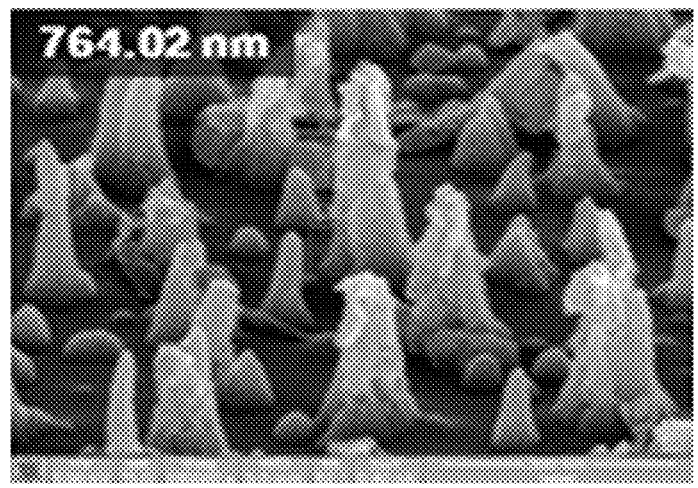
FIG. 7 is a FIB picture illustrating a nanowire according to Exemplary embodiment 4.

Manufacturing of a Nanowire by Performing Heat Treatment and 160 Seconds of Plasma Treatment Exemplary embodiment 4 employs the same condition and method of Exemplary embodiment 1, except the plasma treatment is performed for 160 seconds. The FIB picture of FIG. 7 shows that the silicon oxide (SiO$_2$) nanowire grows to 764.02 nm in length with 160 seconds of the plasma treatment.

Embodiments of the present system and method are disclosed herein for purposes of illustration. The present system and method, however, are not limited to these embodiments. Various modifications may be made by those of ordinary skill in the pertinent art without departing from the scope and spirit of the present teachings.

What is claimed is:

1. A method of manufacturing a nanowire, the method comprising:
    forming a silicon oxide layer by performing deposition of a silicon oxide on a substrate;
    forming a metal layer by performing deposition of a metal on the silicon oxide layer;
    forming a metal agglomerate by performing heat treatment on the substrate where the metal layer is formed; and
    growing a nanowire in an area where the metal agglomerate is formed by performing plasma treatment on the substrate where the metal agglomerate is formed, wherein the nanowire is grown between the metal agglomerate and the substrate.

2. The method of claim 1, wherein forming the silicon oxide layer comprises performing one of chemical vapor deposition (CVD) and plasma enhanced chemical vapor deposition (PECVD).

3. The method of claim 1, wherein the silicon oxide layer has a thickness of 80 nm to 120 nm.

4. The method of claim 1, wherein the metal is one of silver (Ag), copper (Cu), gold (Au), aluminum (Al), magnesium (Mg), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), niobium (Nb) and metal alloys thereof.

5. The method of claim 4, wherein the metal is silver (Ag) or a silver alloy.

6. The method of claim 1, wherein forming the metal layer comprises performing one of a sputtering method, a vacuum deposition method, and an electroplating method.

7. The method of claim 1, wherein the metal layer has a thickness of 5 nm to 20 nm.

8. The method of claim 1, wherein the heat treatment is performed at a temperature of 50° C. to 600° C.

9. The method of claim 1, wherein the plasma treatment uses gas comprising at least one of chlorine (Cl$_2$) gas, nitrogen (N$_2$) gas, argon (Ar) gas and hydrogen (H$_2$) gas.

10. The method of claim 1, further comprising: removing the residual metal agglomerate from a surface of the nanowire by performing wet etching on the substrate where the nanowire grows.

* * * * *